United States Patent [19]
Shinohara et al.

[11] Patent Number: 5,331,516
[45] Date of Patent: Jul. 19, 1994

[54] PORTABLE SEMICONDUCTOR APPARATUS

[75] Inventors: Takayuki Shinohara; Masatoshi Kimura, both of Itami, Japan

[73] Assignee: Mitsubishi Denki Kabushiki Kaisha, Tokyo, Japan

[21] Appl. No.: 2,056

[22] Filed: Jan. 8, 1993

[30] Foreign Application Priority Data

Jan. 16, 1992 [JP] Japan .................................. 4-005780

[51] Int. Cl.⁵ .......................................... H01R 23/68
[52] U.S. Cl. .................................. 361/785; 361/752;
361/792; 361/744; 439/44; 257/686
[58] Field of Search ............... 361/380, 392, 393, 396,
361/397, 412, 413, 414, 729, 736, 744, 748, 752,
761, 778, 785, 784, 792; 439/44–47, 74, 75;
257/686

[56] References Cited

U.S. PATENT DOCUMENTS

| | | | |
|---|---|---|---|
| 4,214,120 | 7/1980 | Jones | 174/52 FP |
| 4,323,293 | 4/1982 | DeRouen et al. | 339/17 CF |
| 4,367,910 | 1/1983 | Seidler | 339/275 B |
| 4,592,617 | 6/1986 | Seidler | 339/275 B |
| 4,766,478 | 8/1988 | Dennis | 357/70 |
| 4,782,589 | 11/1988 | Dennis | 29/827 |
| 5,136,779 | 8/1992 | Abel et al. | 29/827 |

FOREIGN PATENT DOCUMENTS 0366141 5/1990 European Pat. Off. .
3942392 6/1990 Fed. Rep. of Germany .
2243493 10/1991 United Kingdom .
2248973 4/1992 United Kingdom .

OTHER PUBLICATIONS

Ecker et al, "Printed Wiring Card And Board Package For Semiconductor", IBM Technical Disclosure Bulletin, vol. 24, No. 11A, Apr. 1982, pp. 5453–5455.

Primary Examiner—Leo P. Picard
Assistant Examiner—Young Whang
Attorney, Agent, or Firm—Leydig Voit & Mayer

[57] ABSTRACT

The present invention makes it easier to connect board modules to each other and to increase reliability in a portable semiconductor apparatus having two board modules within a frame. Upper-row connection pins and lower-row connection pins have electrode leads, each having connection portions divided into two parts that are arranged in respective upper and lower rows. One of the board modules is inserted between one upper-row electrode lead and one lower-row electrode lead and electrically connected. The other board module is inserted between another upper-row electrode lead and another lower-row electrode lead and electrically connected. In this way, the board modules are electrically connected to each other.

14 Claims, 9 Drawing Sheets

PORTABLE SEMICONDUCTOR APPARATUS

BACKGROUND OF THE INVENTION

1. Field of the Invention

The present invention relates to a portable semiconductor apparatus and, more particularly, to a connection between a connector and board modules.

2. Description of the Related Art

Figure 14:
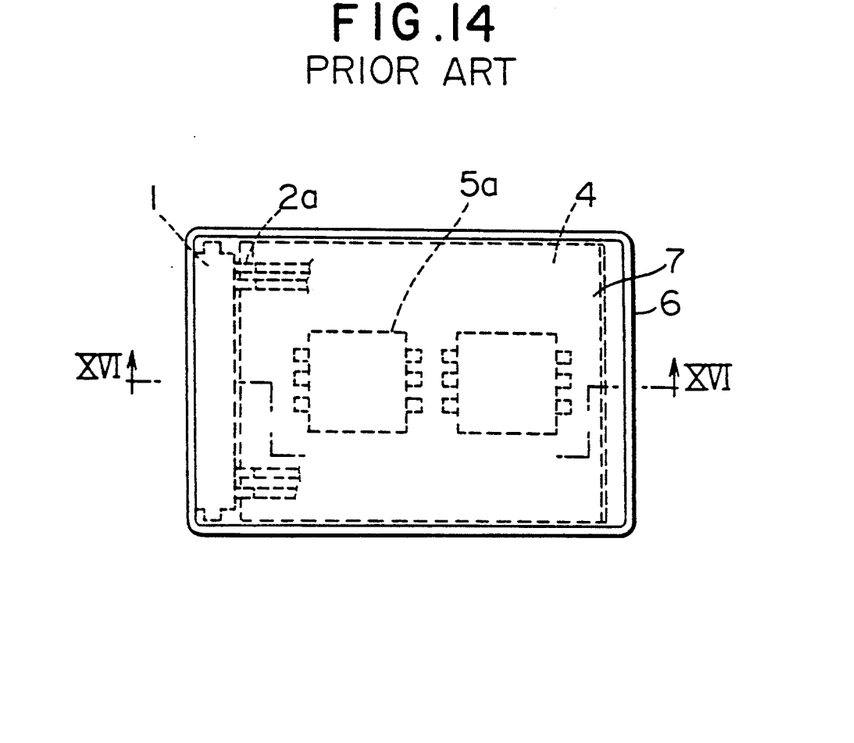
FIG. 14 is a plan view of a conventional portable semiconductor apparatus.
Figure 15:
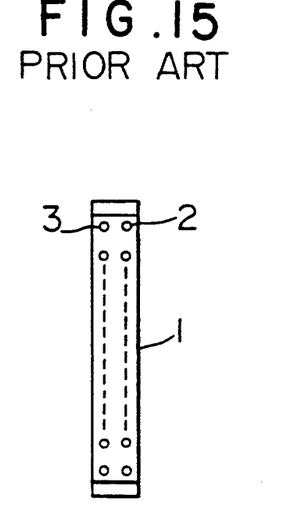
FIG. 15 is a side view of the apparatus shown in FIG. 14, seen from the left side thereof.
Figure 16:
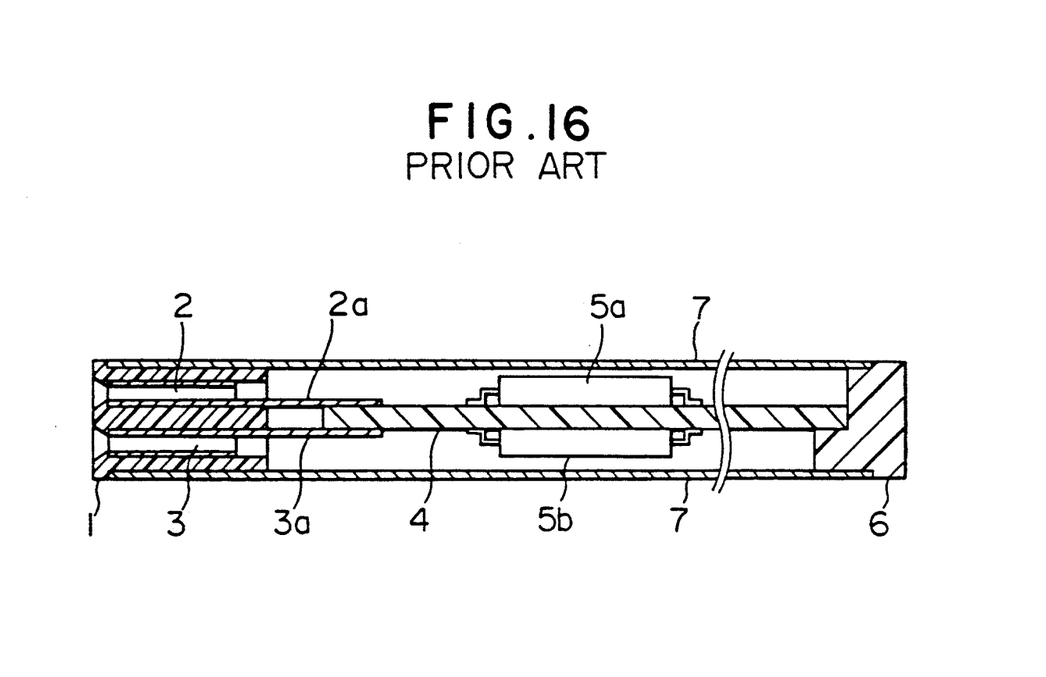
FIG. 16 is a sectional view of the apparatus of FIG. 14 taken along the line XVI—XVI in FIG. 14.

FIG. 14 is a perspective plan view illustrating a conventional portable semiconductor apparatus. FIG. 15 is a side view of the storage apparatus shown in FIG. 14, seen from the left side thereof. FIG. 16 is a sectional view taken along the line XVI—XVI in FIG. 14. In FIG. 14, a connector 1 for making an electrical connection with external devices, and a board module 4 having electronic parts 5a and 5b mounted on both main sides of a circuit board are housed and fixed within a frame 6. The board module 4 is fixed in substantially the center of the frame 6 in a direction parallel to the thickness of the frame 6. The upper and lower sides of the frame 6 are each covered by a lid i.e. metallic panel 7, to protect the electronic parts from electrostatic charge and external noise (see FIG. 16).

Circuit patterns (partially indicated in FIG. 14 by dashed lines) are formed on both main sides of the board module 4. The electronic parts 5a and 5b are mounted so as to be electrically connected to these circuit patterns. Connection pins are provided in two separate rows in such a way that a plurality of upper-row connection pins 2 and a plurality of lower-row connection pins 3 are provided in the connector 1 by which connection with external devices (not shown) is made. These connection pins are female connection pins. As shown in FIG. 16, upper-row electrode leads 2a of the corresponding upper-row connection pins 2 are connected to a circuit pattern (not shown) on one of the main sides of the circuit board, and lower-row electrode leads 3a of the corresponding lower-row connection pins 3 are connected to a circuit pattern on the other main side thereof.

The connection pins 2 and 3 of the connector 1, and the electrode leads 2a and 3a thereof, are each formed from a single piece of metal. When the electrode leads 2a and 3a are soldered to the circuit pattern of the circuit board, the electronic parts 5a and 5b mounted on both main sides thereof are electrically connected to the connection pins 2 and 3 of the connector 1, respectively. As mentioned above, the connector 1 and the board module 4 are housed and fixed within the frame 6, and thereafter the panels 7 are mounted on respective upper and lower sides of the frame 6.

In recent years, the technology for making packages for circuit boards and making electronic parts thinner has been advanced. As a result, the thickness of the board module has been reduced to half that of the conventional one. Mounting two board modules in a frame having the same thickness as that of a frame in which one board module is mounted has been studied. An example of a portable semiconductor apparatus having two board modules 4a and 4b provided within the frame 6 is shown in the sectional view of FIG. 17. The electronic parts 5a and 5b are mounted on both sides of the circuit board of the board module 4a. In a similar manner, electronic parts 5c and 5d are mounted on both sides of the circuit board of the board module 4b. All the upper-row electrode leads 2a of all the corresponding upper-row connection pins 2 are connected to the upper board module 4a, and all the lower-row electrode leads 3a of all the corresponding lower-row connection pins 3 are connected to the lower board module 4b.

Figure 17:
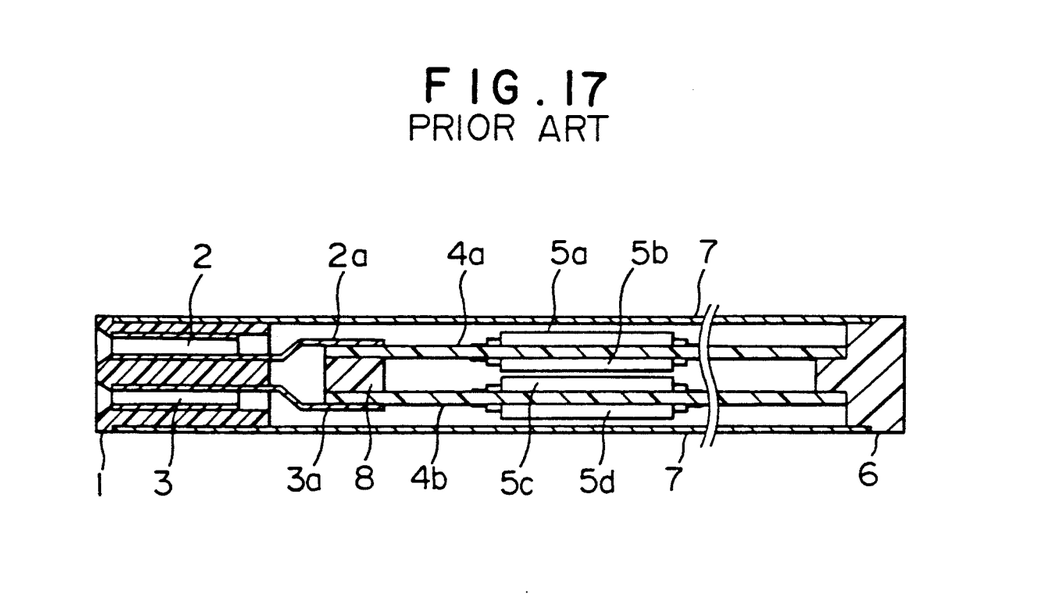
FIG. 17 is a side view of another conventional portable semiconductor apparatus.

In such a construction, upper-lower board connection means 8 must be provided to make an electrical connection between the board modules 4a and 4b. Hitherto, anisotropic electroconductive materials, relay boards formed from connection pads and through holes, and the like have been used as the upper-lower board connection means 8.

Since a conventional portable semiconductor storage apparatus is constructed as described above, upper-lower board connection means formed from anisotropic electroconductive materials, relay boards and the like must be provided to make the electrical connection between these board modules when two separate board modules are provided within a frame. However, in a case where these upper-lower board connection means are used, there are problems. For example, assembly of such a storage apparatus is difficult, the yield is poor, manufacturing costs are high, and so forth.

SUMMARY OF THE INVENTION

The present invention has been achieved to solve the above-mentioned problems of the prior art.

An object of the present invention is to provide a portable semiconductor apparatus having a single frame in which two separate board modules can be very easily mounted.

According to one aspect of the present invention, there is provided a portable semiconductor apparatus comprising: a frame; at least one board module having electronic parts mounted on both sides of a circuit board on which circuit patterns are formed, which module is housed and fixed within the frame; a connector having a plurality of connection pins, in each of which pins an electrode lead portion which is divided into a plurality of portions is integrally formed, each of which portions is individually electrically connected to the board module, the connector being housed and fixed within the frame so as to make a connection with outside possible; and two protective panels mounted on opposite sides of the frame, covering the board module and the connector.

According to another aspect of the present invention which achieves the above object, upper-lower board connection means for making connection between board modules may be provided when two board modules are housed and fixed within a single frame.

In the portable semiconductor apparatus of the present invention, an end portion of an electrode lead connected to each connection pin of the connector is divided into two, or two electrode leads are formed in each connection pin, each lead being individually connected to the board module. When, for example, two board modules are housed and fixed within a single frame, one of the two divided end portions of the electrode leads is bent, the two divided portions being connected to the two board modules, respectively. As a result, the same signal and the same electrical potential are supplied to the two board modules.

Furthermore, inter-board connection leads in the shape of a sideways U fixed to the connector, or inter-board connection leads fixed to the side of the frame opposite to the connector are provided to make an electrical connection between the board modules.

DESCRIPTION OF THE PREFERRED EMBODIMENTS

Embodiments of the present invention will be explained below with reference to the accompanying drawings.

Figure 1:
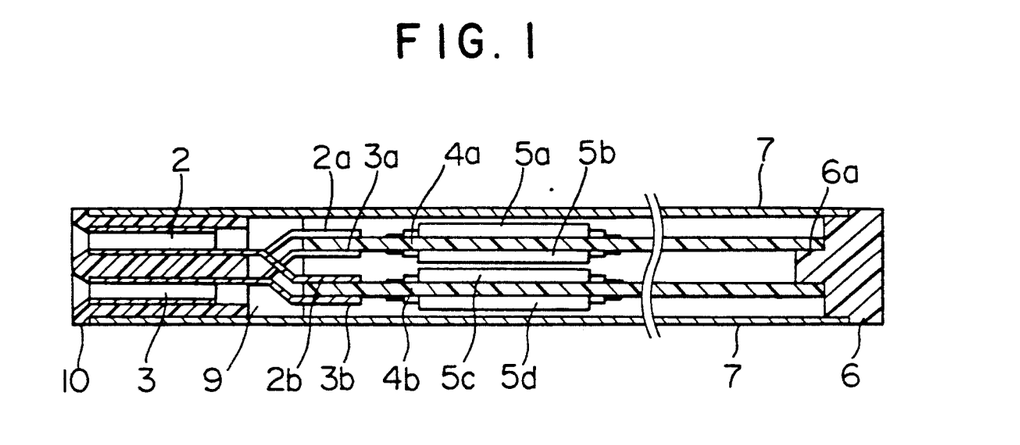
FIG. 1 is a sectional view of a portable semiconductor apparatus according to a first embodiment of the present invention.
Figure 2:
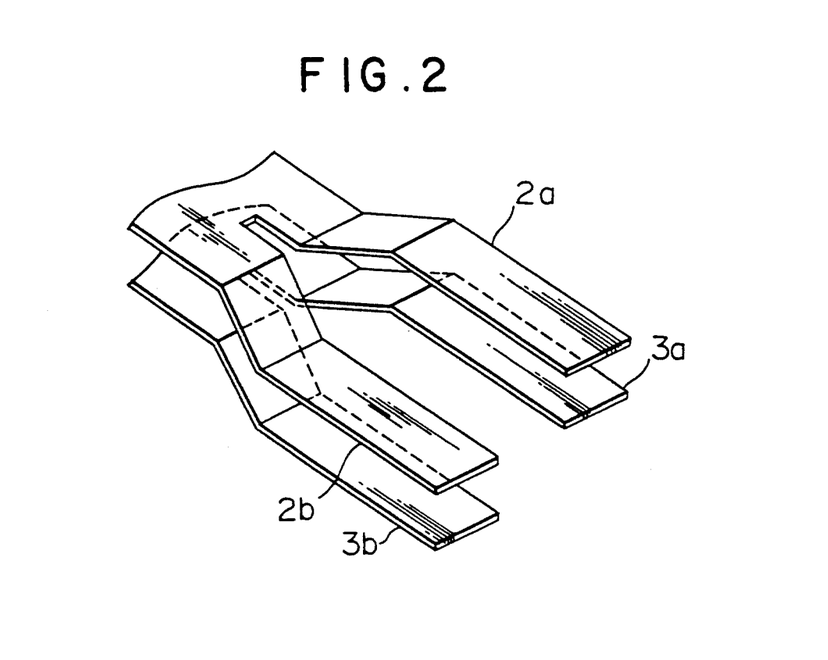
FIG. 2 is an enlarged perspective view illustrating an electrode lead portion of the apparatus shown in FIG. 1.

A portable semiconductor apparatus according to a first embodiment of the present invention is shown in FIGS. 1 and 2. FIG. 1 is a sectional view of the portable semiconductor apparatus. Components which are the same as in the conventional apparatus in FIG. 17 are given the same reference numerals, and thus a detailed explanation thereof is omitted. Two board modules 4a and 4b are housed in the frame 6. These modules are supported by and fixed to, for example, a board support portion 6a formed along the inner periphery of the frame 6 on opposite sides thereof. The positions of the two board modules 4a and 4b in the thickness direction within the frame 6 are determined by the board support portion 6a. The connection pins 2 and 3 are disposed in two separate upper and lower rows in the connector 10 in a plurality of upper-row connection pins 2 and a plurality of lower-row connection pins 3. The upper-row electrode leads protrude from the corresponding upper-row connection pins 2, and their end portions are divided into two, as indicated by reference numerals 2a and 2b. In a similar manner, the lower-row electrode leads protrude from the corresponding lower-row connection pins 3, and their end portions are divided into two, as indicated by reference numerals 3a and 3b. These electrode leads extend from an area inside of the frame of the connection pin. FIG. 2 is an enlarged view of portions of divided electrode leads 2a, 2b, 3a and 3b extending from a plurality of connection pins 2 and 3.

The board module 4a is inserted between the electrode leads 2a and 3a, and the board module 4b is inserted between the electrode leads 2b and 3b. The electrode leads 2a and 3a are connected by soldering or the like to board connection pads (not shown), at the end of both main sides of the circuit board of the board module 4a. In a similar manner, the electrode leads 2b and 3b are connected by soldering or the like to a board connection pads of the circuit board of the board module 4b. As a result, the board modules 4a and 4b are connected in parallel to external devices (not shown) by the connector 10. Since the connection pins 2 and 3 in the upper and lower rows, respectively, are connected to the two board modules 4a and 4b, respectively, the signals and the electrical potentials of the connection pins in the upper and lower rows are linked and connected. Therefore, it is possible to connect the two board modules 4a and 4b, which are separate bodies, to each other as if they were one board module.

A projected portion 9 for stopping a board module is formed on both sides facing the board module of the connector 10. The projected portion 9 prevents electrode leads from being deformed as a result of the end of the board module striking the bent portion of the electrode lead when a circuit pattern (not shown) on the circuit board of the board modules 4a and 4b is soldered to electrode leads 2a, 2b, 3a and 3b, and makes the positioning of each board module easier.

Figure 3:
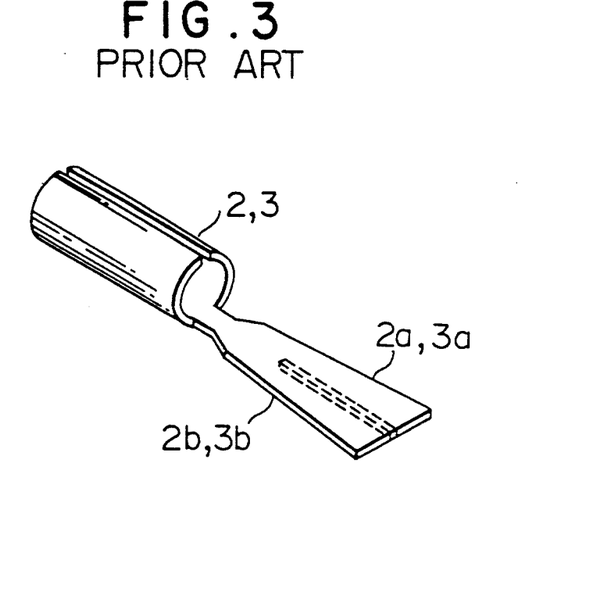
FIG. 3 is an enlarged perspective view of a connection pin and the electrode lead portion of the apparatus shown in FIG. 1.

The connection pins 2 with which the electrode leads 2a and 3a are integral can be formed from, for example, a single metallic plate. As shown in FIG. 3, the connection pins 2 are formed by forming a metallic plate into a cylindrical form. It is then fitted to the main body of the connector in the condition shown in FIG. 3. After it is fixed to the connector, the exposed electrode lead portion is divided into the two electrode leads 2a and 2b, as indicated by dotted lines. Furthermore, the divided electrode leads 2a and 2b are bent (formed) to a desired form in accordance with the positions of the board modules 4a and 4b, as shown in FIG. 2. This operation applies to the connection pins 3.

Figure 5:
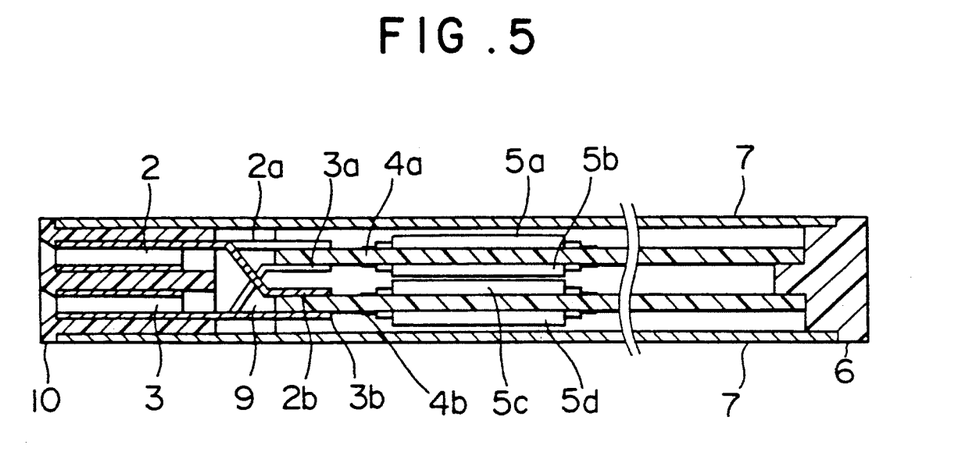
FIG. 5 is a sectional view of a portable semiconductor apparatus according to a second embodiment of the present invention.
Figure 6:
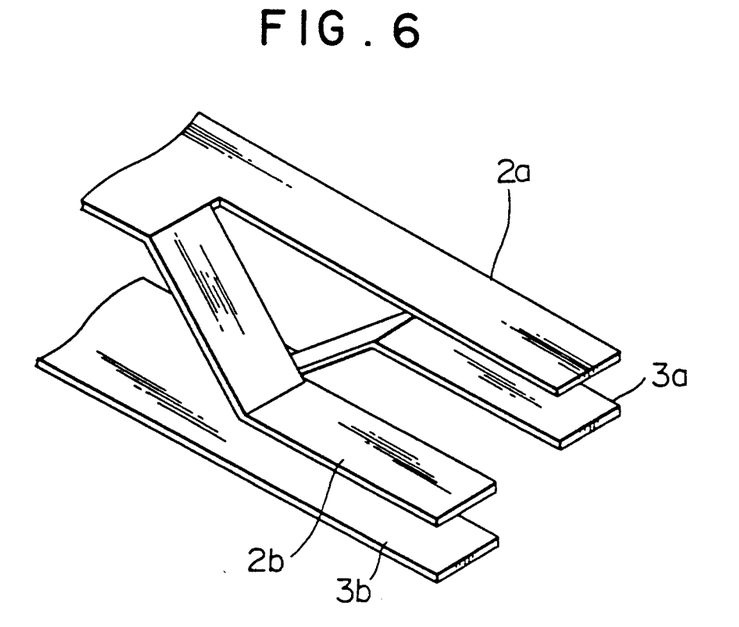
FIG. 6 is an enlarged perspective view illustrating an electrode lead portion of the apparatus shown in FIG. 5.

FIGS. 5 and 6 show a portable semiconductor apparatus according to a second embodiment of the present invention. FIG. 5 is a sectional view of the portable semiconductor apparatus. FIG. 6 is an enlarged view of the portions of the divided electrode leads 2a, 2b, 3a and 3b extending from a plurality of connection pins 2 and 3 of FIG. 5. In this embodiment, the divided electrode leads 2a and 2b of the upper-row connection pins 2, and the divided electrode leads 3a and 3b of the lower-row connection pins 3 extend from the areas near the upper and lower panels 7 (outer areas). The electrode leads 2a and 3b are soldered to the board modules 4a and 4b without being bent, and the electrode leads 2b and 3a are bent and soldered to the board modules 4b and 4a, respectively.

Even though connection pins 2 and 3 in two upper and lower rows are provided in the connector 10 in the above-described first and second embodiments, even a connector on which connection pins having electrode leads divided into two are arranged in a row has an equivalent advantage with regard to the interconnection of board modules. Though an apparatus having two board modules 4a and 4b housed within the frame 6 has been explained, a single board module may be provided within the frame 6, and two electrode leads 2a and 2b extending from corresponding connection pins may be connected to the obverse and rear sides of the board module, respectively. In this case, the degree of freedom of connection between both sides of one board module increases. For example, a through hole which passes through the circuit board need not be formed. In addition, electrode leads of corresponding connection pins are divided into three or more, and it becomes possible to house three or more board modules in a single frame and connect these to each other.

Figure 7:
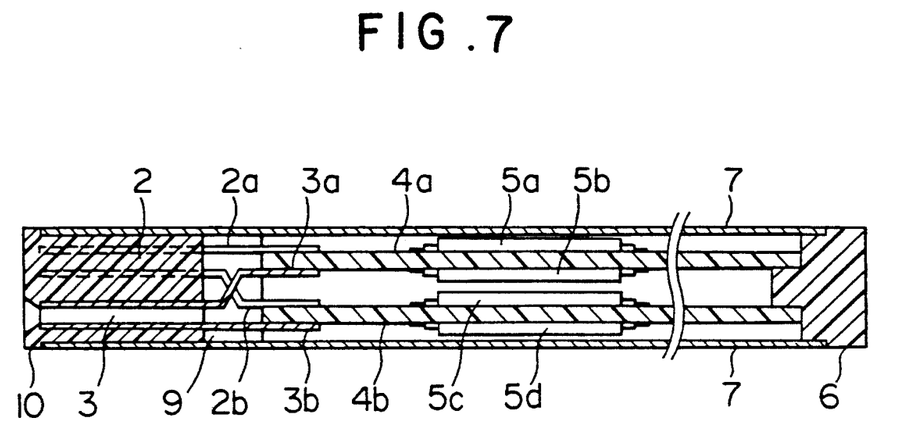
FIG. 7 is a sectional view of a portable semiconductor apparatus according to a third embodiment of the present invention.
Figure 8:
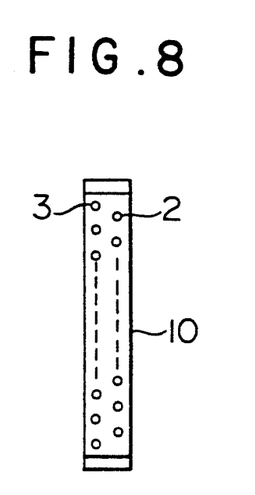
FIG. 8 is a side view of the apparatus shown in FIG. 7, seen from the left side thereof.
Figure 9:
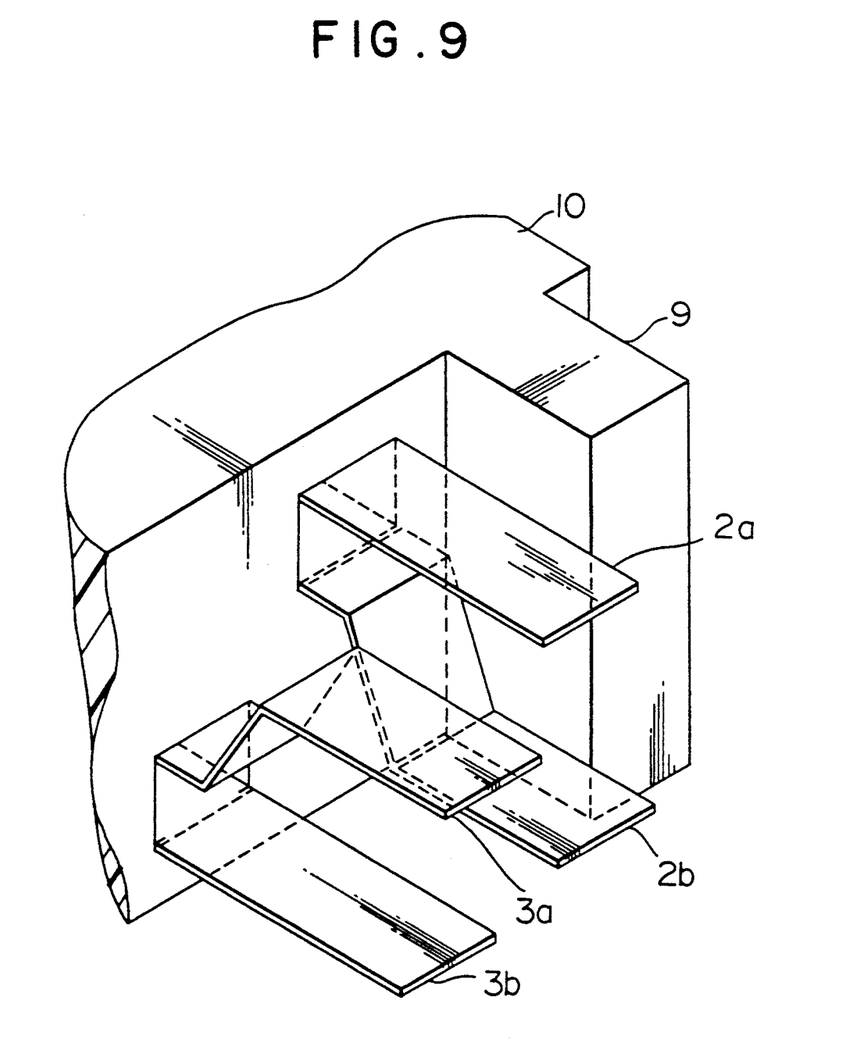
FIG. 9 is an enlarged perspective view illustrating the vicinity of electrode lead portions of the apparatus shown in FIG. 7.

FIGS. 7, 8 and 9 show a portable semiconductor apparatus according to a third embodiment of the present invention. FIG. 7 is a sectional view of the portable semiconductor apparatus according to the third embodiment; FIG. 8 is a side view of the apparatus shown in FIG. 7, seen from the right side thereof; and FIG. 9 is an enlarged perspective view illustrating the vicinity of electrode lead portions of the apparatus.

Figure 4:
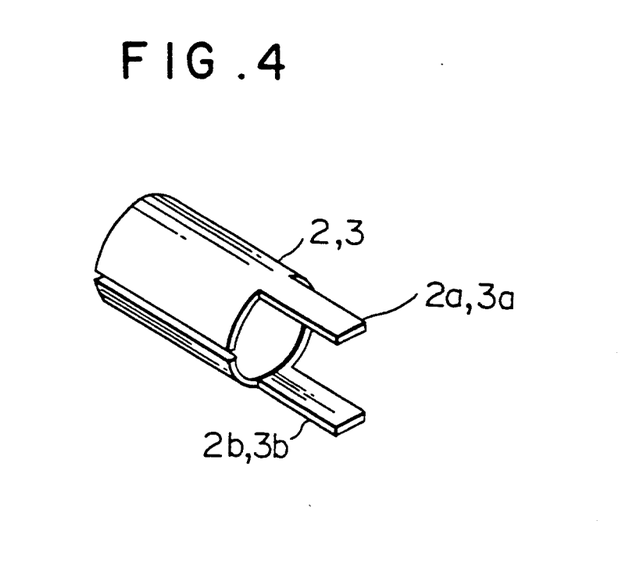
FIG. 4 is an enlarged perspective view of a connection pin and the electrode lead portion of the apparatus shown in FIG. 7.

In this embodiment, the upper-row connection pins 2 and the lower-row connection pins 3 are arranged in the connector 10 shifted from each other. The connection pins are arranged in a zigzag form as a whole. The electrode leads 2a and 2b extend from the connection pins 2 from two upper and lower portions, and the electrode leads 3a and 3b extend from the connection pins 3. An example of this connection pin shown is in FIG. 4.

A connection pin having two electrode leads formed integrally therewith is formed by forming a single metallic plate. A portion of the connection pin is formed by forming a metallic plate into a cylindrical form. It is then fitted to the main body of the connector in the condition shown in FIG. 4. After it is connected to the connector, the electrode leads 2a and 2b are bent (formed) into a desired form in accordance with the positions of the board modules 4a and 4b, as shown in FIG. 9, and completed. This operation applies to the connection pins 3. In this embodiment, the electrode leads 2a and 3b are soldered without being bent to the board modules 4a and 4b, respectively. The electrode leads 2a and 3b are bent and soldered to the board modules 4b and 4a, respectively. As a result, the board module 4a is inserted between the electrode leads 2a and 3a, and the board module 4b is inserted between the electrode leads 2b and 3b. Thus, an electrical interconnection is made. Also in this embodiment, the projected portion 9 for stopping a board module is formed on both sides of the connector facing the board module in order to prevent electrode leads of the connector from being deformed when the board modules are soldered to the connector, and to make the positioning of each board module easy.

Figure 10:
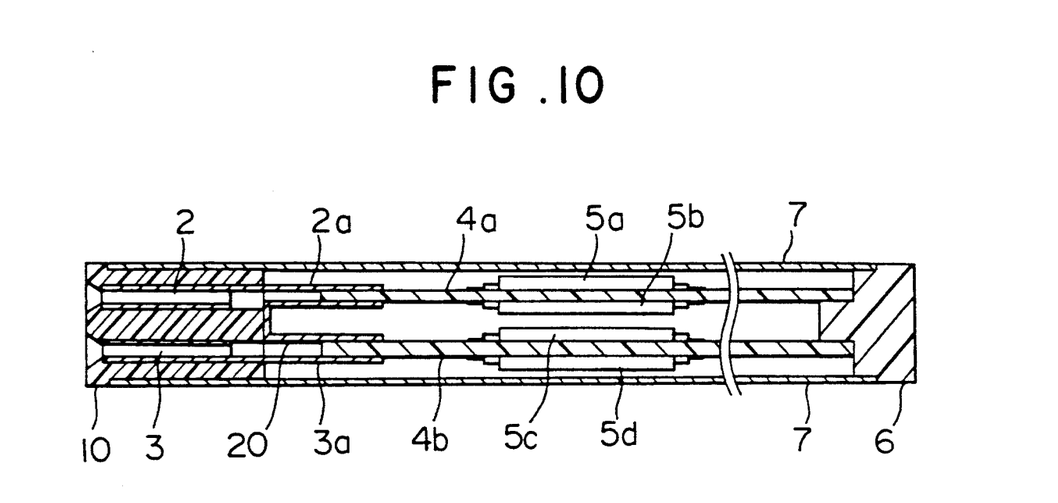
FIG. 10 is a sectional view of a portable semiconductor apparatus according to a fourth embodiment of the present invention.
Figure 11:
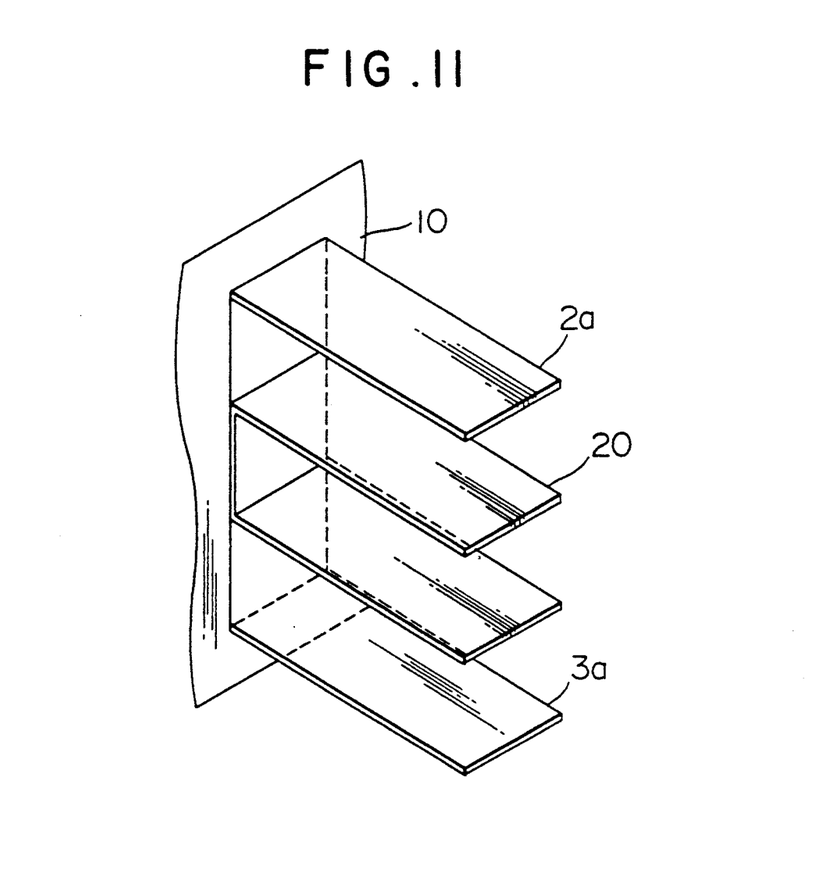
FIG. 11 is an enlarged perspective view illustrating the vicinity of electrode lead portions of the apparatus shown in FIG. 10.

FIGS. 10 and 11 show a portable semiconductor apparatus according to a fourth embodiment of the present invention. FIG. 10 is a sectional view of the portable semiconductor apparatus according to the fourth embodiment. FIG. 11 is an enlarged perspective view illustrating the vicinity of electrode lead portions of the apparatus shown in FIG. 10. An inter-board connection lead 20, which an inter-board connection means, is a lead from an electroconductive material formed in the shape of a sideways U in order to make an electrical connection between the board modules 4a and 4b. This connection lead 20 is provided between the electrode leads 2a and 3a protruding from the connection pins 2 and 3 in two upper and lower rows in the connector 10. The connection lead 20 is fixed to the main body of the connector by press-fitting or contact.

Of the two board modules 4a and 4b housed within the frame, the board module 4a is inserted between the electrode lead 2a and one of the ends of the connection lead 20 and then soldered. The board module 4b is inserted between the electrode lead 3a and the other end of the connection lead 20 and then soldered. As a result, signals from the upper-row connection pins 2 of the connector 10 are connected to the board module 4a, and signals from the lower-row connection pins 3 are connected to the board module 4b. In addition, connection of signals between the two board modules 4a and 4b is performed by the inter-board connection lead 20. This connection lead 20 may not be provided between all the upper and lower connection pins 2 and 3. The connection lead 20 may be provided as required in combination with connection pins of the above-described embodiments having electrode leads whose end portions are divided into two.

Figure 12:
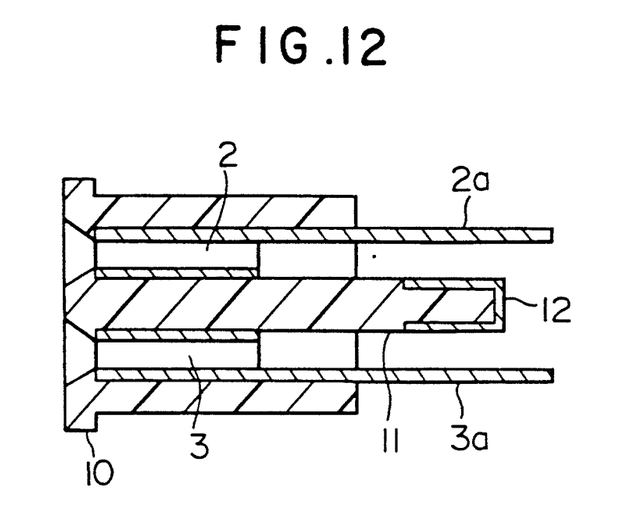
FIG. 12 is an enlarged perspective view of a connector of a portable semiconductor apparatus according to a fifth embodiment of the present invention.

FIG. 12 shows a sectional view of the connector 10 of a portable semiconductor apparatus according to a fifth embodiment of the present invention. In this embodiment, a projected portion 11 for connecting boards is provided on the main body of the connector between the upper and lower electrode leads 2a and 3a of the connector 10. An electrode 12 for connecting boards is provided on the surface of the end portion of the projected portion 11. This electrode 12 is formed by fitting a metallic plate into the projected portion 11 or by vapor-deposition plating. The board module 4a is inserted between the electrode lead 2a and one of the sides of the board connection electrode 12 and then soldered. The board module 4b is inserted between the electrode lead 3a and the other side of the board connection electrode 12 and then soldered. As a result, signals from the upper-row connection pins 2 of the connector 10 are connected to the board module 4a. Signals from the lower-row connection pins 3 thereof are connected to the board module 4b. Connection of signals between the two board modules 4a and 4b is made by the board connection electrode 12. The projected portion 11 and the board connection electrode 12 on the connector 10 may not be provided between all the upper and lower connection pins 2 and 3. They may be provided as required in combination with the connection pins of the above-described embodiments having electrode leads whose end portions are divided into two.

Figure 13:
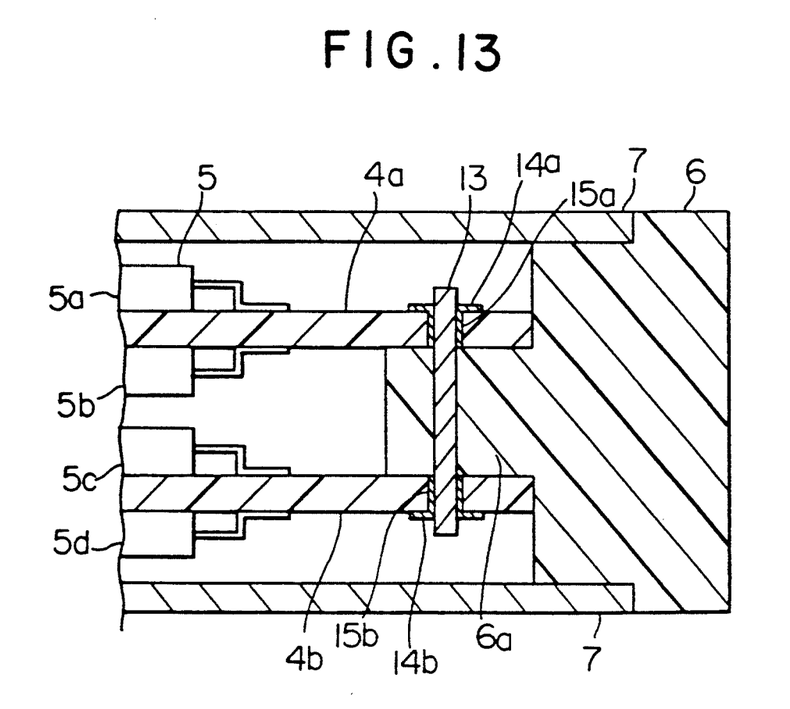
FIG. 13 is an enlarged perspective view illustrating inter-board connection means of a portable semiconductor apparatus according to a sixth embodiment of the present invention.

FIG. 13 shows a sectional view of the portion of interboard connection means of a portable semiconductor apparatus according to a sixth embodiment of the present invention. In this embodiment, the inter-board connection means is provided in a resin frame. An inter-board connection pin 13 is buried by press-fitting in the board support portion 6a of the frame 6 for fixing the two board modules 4a and 4b. Both ends of the connection pin 13 are inserted into through holes 15a and 15b, respectively, in the end portions of the board modules 4a and 4b, and bonded by soldering to lands 14a and 14b in the through holes. As a result of using the frame 6 attached with the connection pin 13 and the connectors of the first to third embodiments, the degree of freedom for signal connection between the connector and the board module, and between board modules is increased.

It goes without saying that the degree of freedom for signal connection between the connector and the board module, and between board modules can be increased on the whole by properly combining improvements made in the connector of the above-described first to third embodiments and improvements made in the inter-board connection means of the abovedescribed fourth to sixth embodiments.

As has been explained above, in a portable semiconductor apparatus according to the present invention, connection pins having electrode leads whose end portions are divided into two, or connection pins having electrode leads integral formed therewith are provided in a connector. As a result, a portable semiconductor apparatus can be provided which permits interconnection between the obverse and rear sides of a board module, further interconnection between board modules in a case where two board modules are provided within a frame to be performed easily, such apparatus having high yields, high reliability, and of high-density mounting.

What is claimed is:

1. A portable semiconductor apparatus comprising:
a frame;
at least two board modules, each board module including a circuit board having two opposed sides, electronic parts mounted on both sides of said circuit board, and circuit patterns on both sides of said circuit board, said board modules being housed and fixed within said frame;
a connector having a plurality of connection pins, each pin including a unitary electrode lead divided into a plurality of connection portions, each connection portion being individually electrically connected to one of said board modules, said connector being housed and fixed within said frame for making external electrical connections; and
two protective panels mounted on opposite sides of said frame, covering said board module and said connector.

2. The portable semiconductor apparatus according to claim 1 wherein the divided connection portions and the corresponding connection pin of each connector are unitary, the electrode leads are divided into two connection portions, and the connection portions are individually electrically connected to respective board modules.

3. The portable semiconductor apparatus according to claim 2 including two board modules housed and fixed within said frame wherein at least one of the two connection portions of the electrode leads of corresponding connection pins is bent and the two connection portions are respectively connected to said two board modules, for supplying a signal and electrical potential to both board modules.

4. The portable semiconductor apparatus according to claim 3 wherein said connection pins of said connector are arranged in two rows that are parallel to said board modules.

5. The portable semiconductor apparatus according to claim 1 wherein the connection portions and the corresponding connection pin are unitary and the connection portions include two electrode leads, the connection portions of the corresponding electrode leads being individually electrically connected to corresponding board modules.

6. The portable semiconductor apparatus according to claim 5 including two board modules housed and fixed within said frame wherein at least one of two connection portions of the two electrode leads is bent and the two portions are respectively connected to said two board modules for supplying a signal and electrical potential to both board modules.

7. The portable semiconductor apparatus according to claim 6 wherein the connection pins of said connector are arranged along zigzag path parallel to said board modules.

8. The portable semiconductor apparatus according to claim 1 comprising inter-board connection means for electrically connecting said board modules to each other wherein said board modules are housed and fixed within said frame.

9. The portable semiconductor apparatus according to claim 8 wherein said connection pins of said connector are arranged in two rows parallel to said board modules and said inter-board connection means comprises U-shaped inter-board connection leads mounted between the electrode leads of the connection pins arranged in two rows in said connector and connected to the two board modules.

10. The portable semiconductor apparatus according to claim 8 wherein the connection pins of said connector are arranged in two rows that are parallel to said board modules and said inter-board connection means comprises a projection facing said board modules for connecting said circuit boards and a board connection electrode on the projection commonly connected to said two board modules.

11. The portable semiconductor apparatus according to claim 8 wherein said inter-board connection means comprises through holes in said two board modules and inter-board connection pins passing through part of said frame and inserted into the through holes of each board module, electrically connecting said two board modules.

12. The portable semiconductor apparatus according to claim 1 wherein each of said divided connection portions of a unitary electrode lead includes two spaced apart end portions that are not coplanar.

13. The portable semiconductor apparatus according to claim 12 wherein said two end portions are disposed side-by-side.

14. The portable semiconductor apparatus according to claim 12 wherein said two end portions are disposed opposite each other.

* * * * *